United States Patent
Tiedemann et al.

(10) Patent No.: US 7,561,430 B2
(45) Date of Patent: Jul. 14, 2009

(54) HEAT MANAGEMENT SYSTEM FOR A POWER SWITCHING DEVICE

(75) Inventors: Larry E. Tiedemann, Winona, MN (US); Reinhold Henke, Plymouth, MN (US); James P. Hentges, Fountain City, WI (US); Dean R. McCluskey, Winona, MN (US); Keith D. Ness, Winona, MN (US); Robert A. Pape, Winona, MN (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 118 days.

(21) Appl. No.: 11/799,057

(22) Filed: Apr. 30, 2007

(65) Prior Publication Data

US 2008/0266810 A1    Oct. 30, 2008

(51) Int. Cl.
*H05K 7/20* (2006.01)

(52) U.S. Cl. ............ 361/719; 361/717; 361/720; 361/721; 174/16.3; 174/252

(58) Field of Classification Search ........ 361/679, 361/688, 700–712, 715–720, 721, 722, 726, 361/775, 777, 761, 762, 793, 794; 174/15.1, 174/16.3, 252, 254, 255; 165/80.2, 80.3, 165/104.33, 185; 156/252, 253, 307.7; 29/832, 29/834; 257/706–712, 722–727
See application file for complete search history.

(56) References Cited

U.S. PATENT DOCUMENTS

| | | | |
|---|---|---|---|
| 4,172,272 A | | 10/1979 | Schneider |
| 4,336,568 A | | 6/1982 | Mitchell |
| 4,394,530 A | * | 7/1983 | Kaufman ............... 174/16.3 |
| 4,941,067 A | * | 7/1990 | Craft .................... 361/721 |
| 4,972,295 A | * | 11/1990 | Suguro et al. ............. 361/706 |
| 5,012,387 A | * | 4/1991 | Ohlenburger ............. 361/708 |
| 5,018,050 A | | 5/1991 | Maenishi et al. |
| 5,375,039 A | * | 12/1994 | Wiesa ................... 361/720 |
| 5,394,301 A | * | 2/1995 | Fassel et al. ............. 361/720 |
| 5,398,160 A | * | 3/1995 | Umeda .................. 361/707 |
| 5,500,785 A | * | 3/1996 | Funada .................. 361/720 |
| 5,576,934 A | * | 11/1996 | Roethlingshoefer et al. . 361/761 |

(Continued)

FOREIGN PATENT DOCUMENTS

DE    36 23 889 A1    1/1987

(Continued)

OTHER PUBLICATIONS

Patent Cooperation Treaty International Search Report Dated Feb. 12, 2008.

*Primary Examiner*—Michael V Datskovskiy
(74) *Attorney, Agent, or Firm*—Brinks Hofer Gilson & Lione

(57) ABSTRACT

A power switching device is provided that includes a housing, a printed circuit board disposed within the housing, and a plurality of electrical components mounted to the printed circuit board, including at least one relay. At least one pair of load terminals is connected to the printed circuit board on opposite sides of the relay, and a plurality of heat transfer elements are formed through and in the printed circuit board and are dispersed proximate the relay, around the load terminals, and extending to the peripheral portion.

33 Claims, 18 Drawing Sheets

U.S. PATENT DOCUMENTS

| | | | |
|---|---|---|---|
| 5,602,363 A | | 2/1997 | Von Arx |
| 5,958,562 A | * | 9/1999 | Tsuji et al. .................. 428/209 |
| 5,978,222 A | | 11/1999 | Iijima et al. |
| 6,222,732 B1 | * | 4/2001 | Jakob et al. ................. 361/704 |
| 6,325,635 B1 | * | 12/2001 | Onizuka ....................... 439/49 |
| 6,493,228 B1 | * | 12/2002 | Suzuki et al. ............... 361/704 |
| 6,593,673 B1 | * | 7/2003 | Sugai et al. ................. 307/116 |
| 6,787,896 B1 | * | 9/2004 | Petty-Weeks ............... 257/700 |
| 6,794,747 B2 | * | 9/2004 | Takehara et al. ............ 257/705 |
| 6,930,885 B2 | * | 8/2005 | Barcley ....................... 361/719 |
| 6,942,499 B2 | * | 9/2005 | Tanaka et al. ............. 439/76.2 |
| 7,054,159 B2 | * | 5/2006 | Nakamura ................... 361/719 |
| 7,133,705 B2 | * | 11/2006 | Akatsuka et al. ......... 455/575.1 |
| 7,149,064 B2 | * | 12/2006 | Nolden et al. ................. 361/23 |
| 7,167,377 B2 | * | 1/2007 | Onizuka et al. ............. 361/775 |
| 2006/0033207 A1 | | 2/2006 | Nakamura et al. |
| 2006/0256533 A1 | | 11/2006 | Scigiel |

FOREIGN PATENT DOCUMENTS

| | | |
|---|---|---|
| EP | 1 524 691 A2 | 10/2004 |
| JP | 2005142256 A * | 6/2005 |
| JP | 02005268648 A * | 9/2005 |

* cited by examiner

HEAT MANAGEMENT SYSTEM FOR A POWER SWITCHING DEVICE

FIELD

The present disclosure relates to high current power switching devices, and more particularly to devices and methods for dissipating heat generated by the power switching devices during operation.

BACKGROUND

The statements in this section merely provide background information related to the present disclosure and may not constitute prior art.

High current power switching devices often include solid-state switching devices, such as solid-state relay (SSRs) by way of example, which are advantageous because they do not include any moving parts, generate a relatively low amount of electrical noise during operation, are compatible with digital circuitry, and have generally greater switching life. However, solid-state switching devices in the form of solid-state relays produce a relatively high voltage drop during operation, and as a result, generate a substantial amount of heat. This heat must be dissipated during operation to prevent malfunction or failure of the power switching device, and is often achieved through bulky and cost consuming heat sinks.

One known form of such a heat sink includes a thermally conductive body that has a plurality of fins or u-shaped members that extend from a base plate such as those disclosed in U.S. Pat. No. 3,536,960 and U.S. Pat. No. 5,010,050 (also referred to as a "radiator"). These known heat sinks are often bulky, heavy, and introduce additional cost and complexity to power switching device applications.

Other known heat sinks include conductive ceramic base portions, or potting compounds, such as those disclosed in U.S. Pat. No. 4,172,272. As with the finned or u-shaped heat sinks as described above, these compounds or filler materials introduce additional bulk, weight, complexity, and cost to power switching devices. Accordingly, improved devices and methods for enhancing heat transfer are continuously desirable in high current power switching device applications.

SUMMARY

In one form of the present disclosure, a power switching device is provided that comprises a housing and a printed circuit board disposed within the housing, wherein the printed circuit board defines a central portion and a peripheral portion surrounding the central portion. A plurality of electrical components are mounted to the printed circuit board and include at least one relay mounted proximate the central portion. At least one pair of load terminals are connected to the printed circuit board proximate the peripheral portion, and the load terminals are disposed on opposite sides of the relay. A plurality of heat transfer elements are formed through the printed circuit board and are dispersed proximate the relay, around the load terminals, and extend to the peripheral portion.

In another form of the present disclosure, a power switching device is provided that comprises a housing having a plurality of vents and a printed circuit board disposed within the housing, wherein the printed circuit board defines a central portion and a peripheral portion surrounding the central portion. A plurality of electrical components are mounted to the printed circuit board and include at least one relay mounted proximate the central portion. At least one pair of load terminals are connected to the printed circuit board proximate the peripheral portion, and the load terminals are disposed on opposite sides of the relay. A plurality of heat transfer elements are formed through the printed circuit board and are dispersed proximate the relay, around the load terminals, and extend to the peripheral portion.

In yet another form of the present disclosure, a printed circuit board for use in a power switching device is provided that comprises a central portion and a peripheral portion surrounding the central portion. A plurality of electrical components are mounted to the printed circuit board and include at least one relay mounted proximate the central portion. At least one pair of load terminals are connected to the printed circuit board proximate the peripheral portion, and the load terminals are disposed on opposite sides of the relay. A plurality of heat transfer elements are formed through the printed circuit board and are dispersed proximate the relay, around the load terminals, and extend to the peripheral portion.

In still another form of the present disclosure, a power switching device is provided that comprises a housing having a raised portion, stepped portions disposed on opposite sides of the raised portion, and a plurality of vents. A printed circuit board is disposed within the housing, and the printed circuit board defines a central portion and a peripheral portion surrounding the central portion. A plurality of electrical components are mounted to the printed circuit board and include a plurality of relays mounted proximate the central portion and within the raised portion of the housing. A plurality of pairs of load terminals are connected to the printed circuit board proximate the peripheral portion, and the load terminals are disposed on opposite sides of the relays. A plurality of heat transfer elements are formed through the printed circuit board and are dispersed proximate the relay, around the load terminals, and extend to the peripheral portion.

Another form of the present disclosure includes a power switching device that comprises a plurality of high current relays mounted to a printed circuit board and a means for dissipating heat from the high current relays to an outside environment without the use of a heat sink member.

An adapter is also provided in another form of the present disclosure, which is used for mounting a power switching device to a DIN rail. The adapter comprises a body defining a plurality of apertures and a plurality of supports, a release lever operatively engaged with the body and defining a lift portion and a locking portion, a raised lip extending along the body opposite the locking portion of the release lever and adapted for engaging the DIN rail, and a plurality of flexible tabs extending from the body. The release lever operatively moves the locking portion to engage and disengage the DIN rail, and the flexible tabs are adapted to engage and disengage the power switching device Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
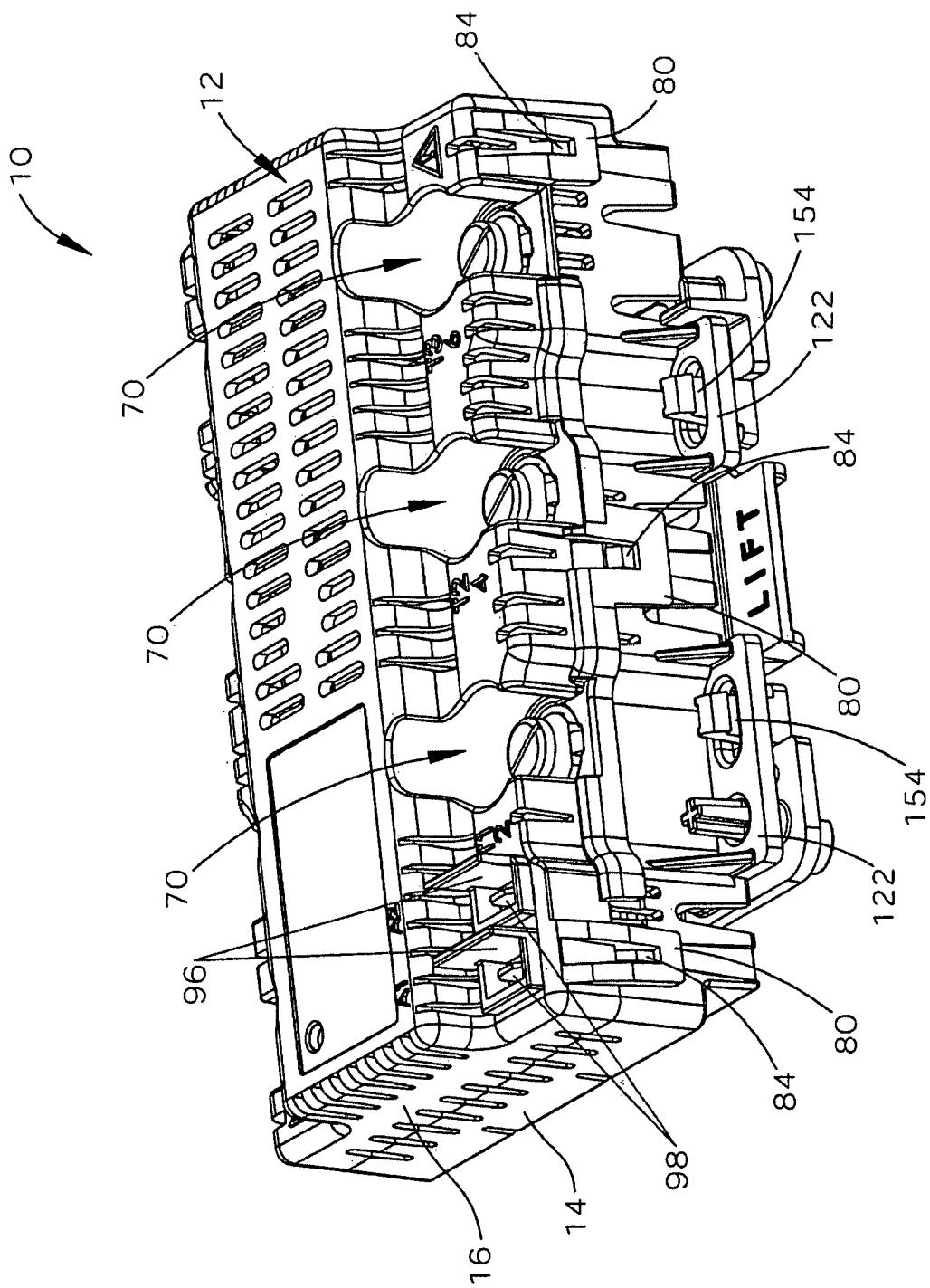
FIG. 1 is a perspective view of a power switching device constructed in accordance with the principles of the present disclosure.

The following description is merely exemplary in nature and is not intended to limit the present disclosure, application, or uses. It should be understood that throughout the drawings, corresponding reference numerals indicate like or corresponding parts and features.

Figure 2:
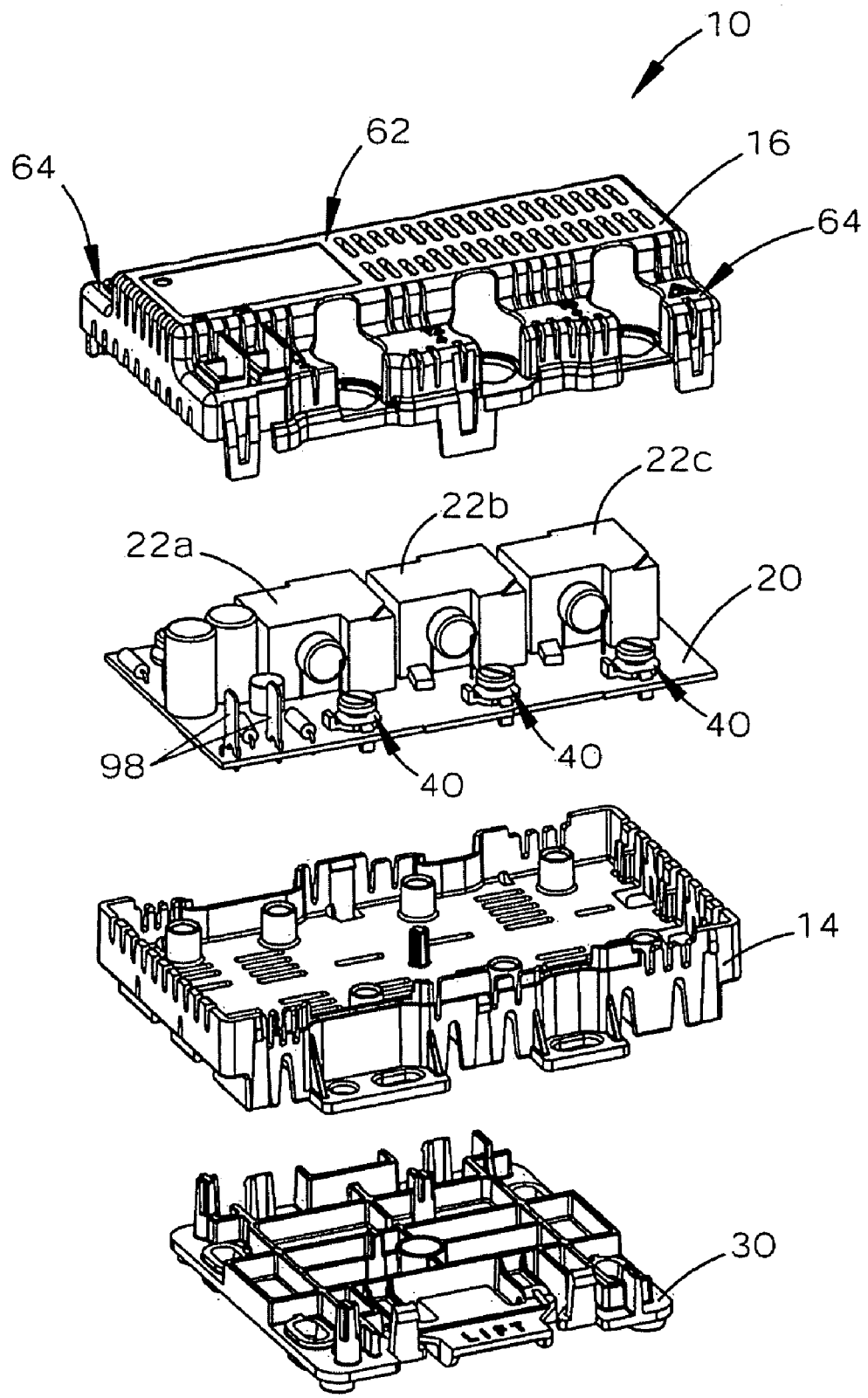
FIG. 2 is an exploded perspective view of the power switching device and its various components in accordance with the principles of the present disclosure.

Referring to FIGS. 1 and 2, a power switching device in accordance with the present disclosure is illustrated and generally indicated by reference numeral 10. As shown, the power switching device 10 comprises a housing 12, which in one form includes a base 14 and a cover 16, which are removably engageable with one another as described in greater detail below. The power switching device 10 also includes a printed circuit board (PCB) 20 disposed within the housing 12 with a plurality of electrical components mounted on the PCB 2 as shown. The electrical components include, by way of example, three (3) relays 22a, 22b, and 22c, which correspond with three-phase operation of the power switching device 10. Operation of the power switching device 10 is described in greater detail in copending application titled "Apparatus and Method for Increasing Switching Life of Electromechanical Contacts in a Hybrid Power Switching Device," filed on Apr. 30, 2007, which is commonly signed with the present application and the contents of which are incorporated by reference herein in their entirety. It should be understood that the number of relays 22 illustrated and described herein is merely exemplary and that one (1), two (2), or any number of relays 22 may be employed while remaining within the scope of the present disclosure. The power switching device 10 further comprises an adapter 30 that is adapted for engagement with the housing 12 and with a DIN rail (not shown), which is described in greater detail below.

Figure 3A:
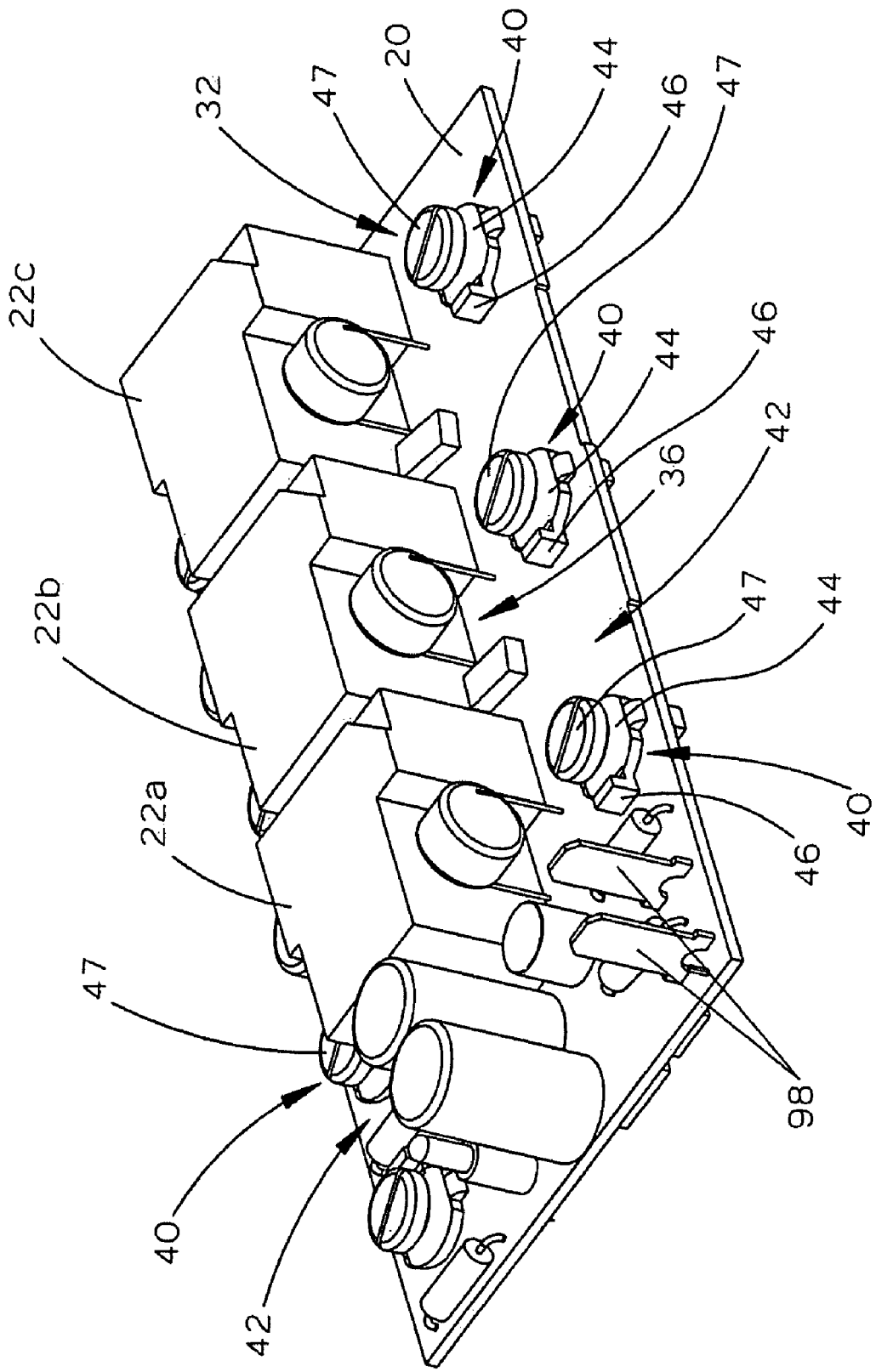
FIG. 3a is a top perspective view of a printed circuit board (PCB) and a plurality of electrical components mounted thereon and constructed in accordance with the principles of the present disclosure.
Figure 3B:
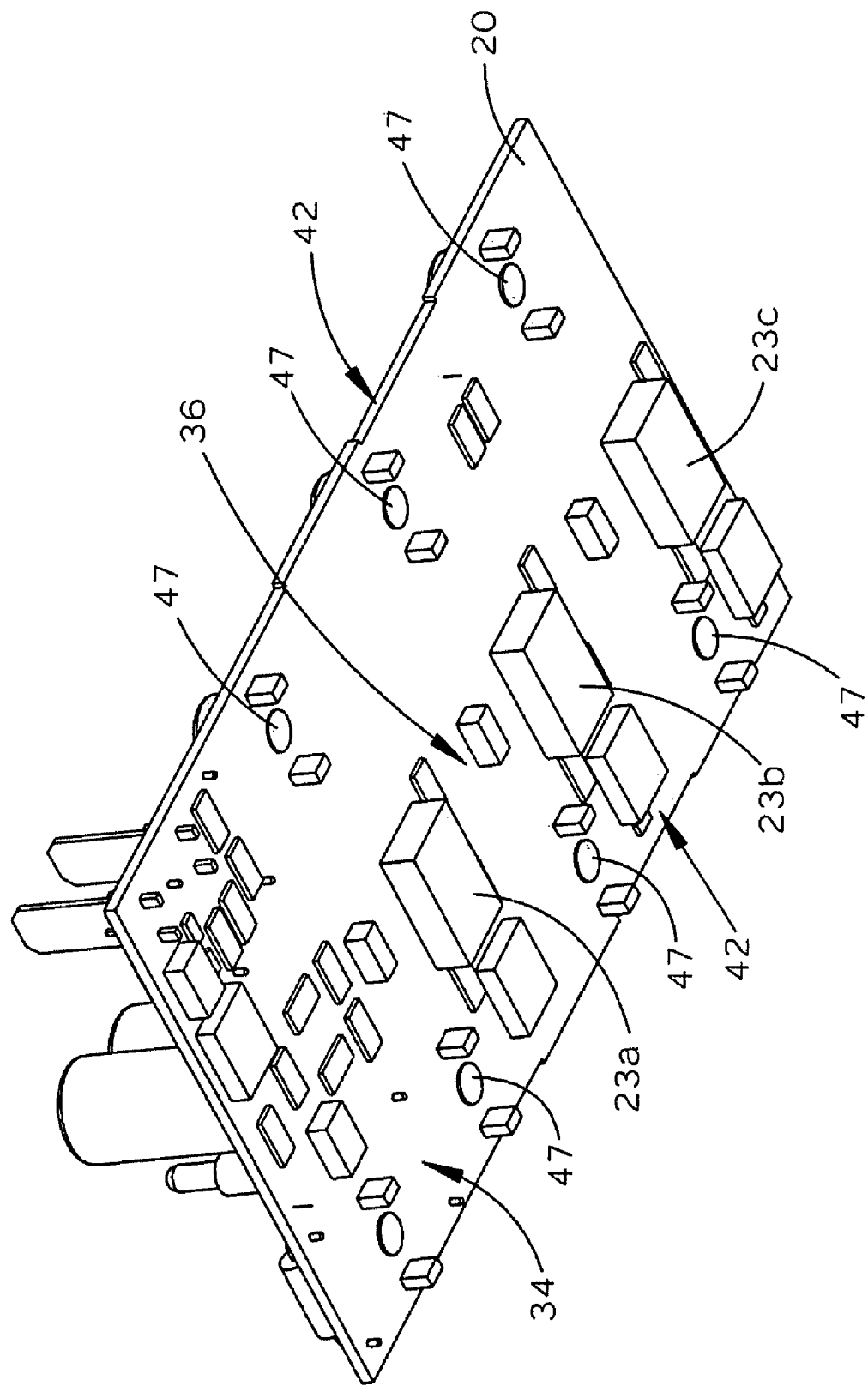
FIG. 3b is a bottom perspective view of the PCB in accordance with the principles of the present disclosure.

Referring now to FIGS. 3a and 3b, the PCB 20 is illustrated in greater detail, including additional electrical components mounted to both sides of the PCB 20. The relays 22a, 22b, and 22c (which are electromechanical relays in one form of the present disclosure) are mounted to a top side 32 of the PCB 20, and additional relays 23a, 23b, and 23c (which are solid-state switches such as triacs in one form of the present disclosure) are mounted to a bottom side 34 of the PCB 20. The relays 22a, 22b, 22c, 23a, 23b, and 23c are preferably mounted proximate a central portion 36 of the PCB 20 as shown.

Figure 4A:
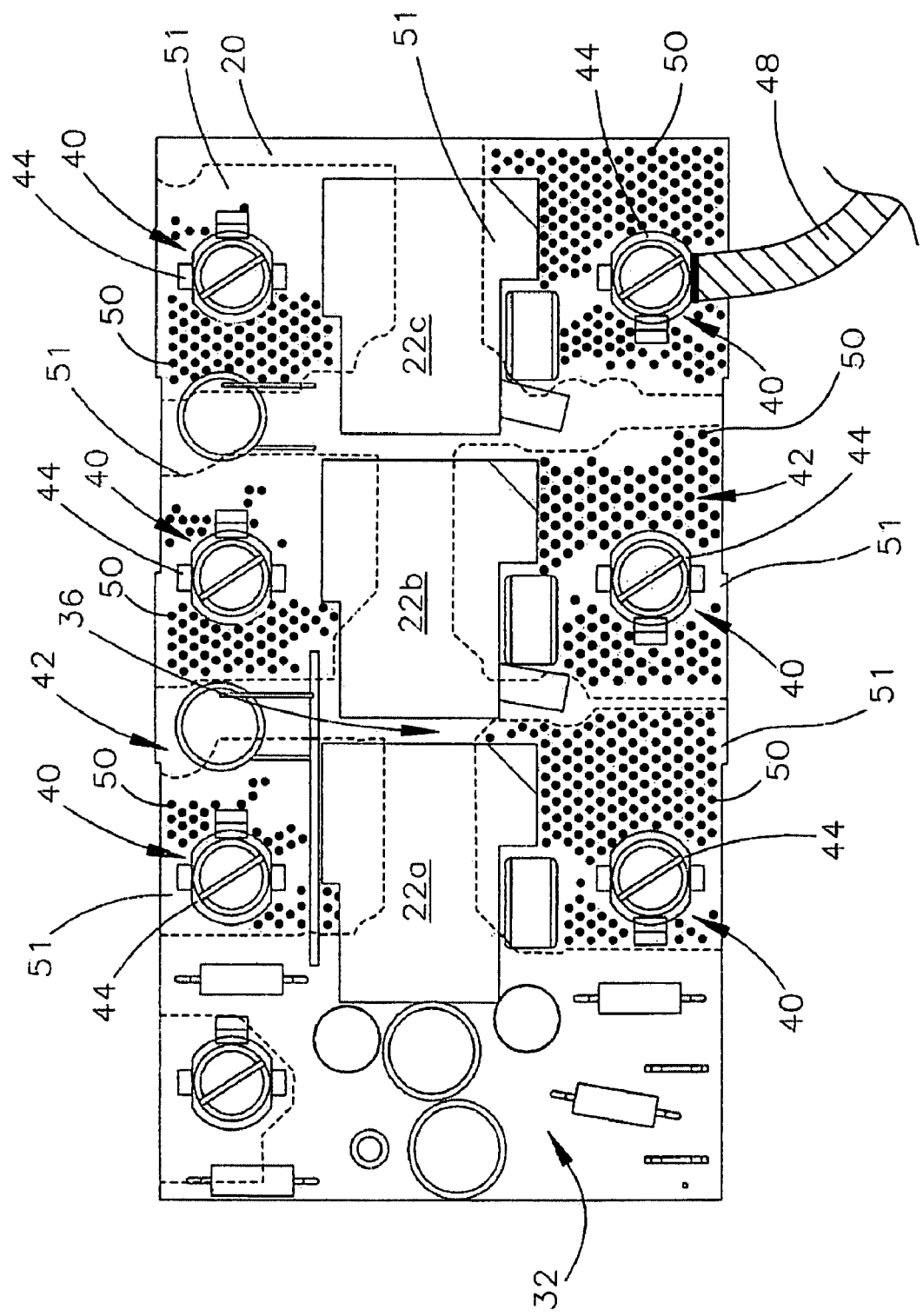
FIG. 4a is a top view of the PCB in accordance with the principles of the present disclosure.
Figure 4B:
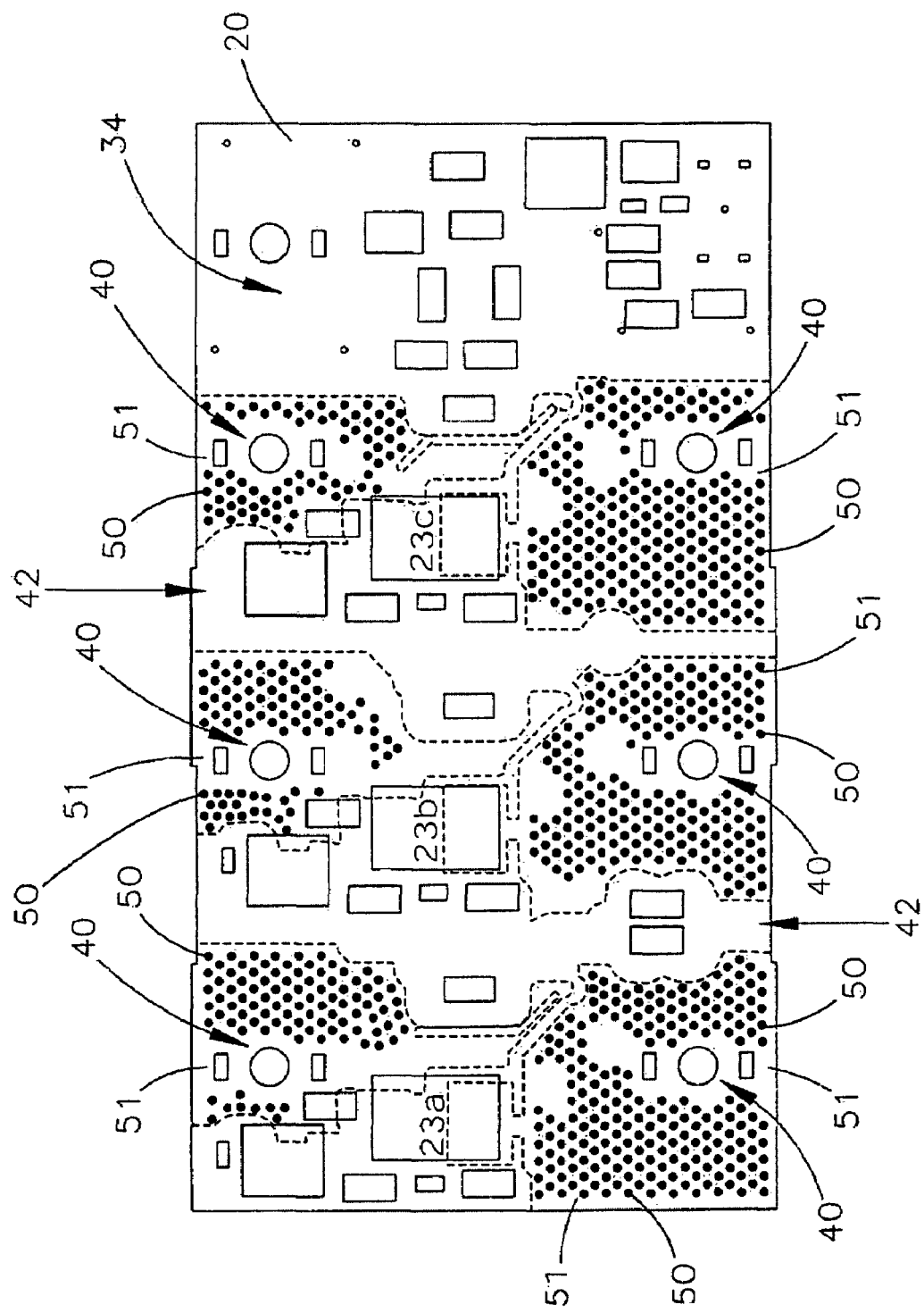
FIG. 4b is a bottom view of the PCB in accordance with the principles of the present disclosure.

As further shown, the PCB 20 also comprises a plurality of load terminals 40 mounted along or proximate a peripheral portion 42 of the PCB 20. The load terminals 40 are preferably arranged in pairs and are disposed on opposite sides of the relays 22 and 23, which is best shown in FIGS. 4a and 4b. As with the relays 22 and 23, there may be a fewer or greater number of load terminals 40 than the three (3) pairs illustrated and described herein. Accordingly, the specific number of load terminals 40 as illustrated and described herein should not be construed as limiting the scope of the present disclosure.

The load terminals 40 preferably include ring terminals 44 as shown, which include extensions 46 (best shown in FIG. 3a) that are adapted to engage features of the housing 12 to prevent the ring terminals 44 from turning, which is described in greater detail below. The load terminals 40 also include corresponding screws 47, which engage the ring terminals 44 to tighten power wire 48 (only one is shown in FIG. 4a for clarity) to the load terminals 40.

Referring now to FIGS. 4a-b and 5a-c, a plurality of heat transfer elements in the form of nodes 50 and lands 51 (shown dashed in FIGS. 4a-b) are formed through and in, respectively, the PCB 20 in order to transfer the heat generated by the electrical components, and primarily the relays 23a, 23b, and 23c, away from the power switching device 10 and to the outside environment. As shown, the heat transfer elements 50 and 51 are preferably dispersed proximate the relays 23a, 23b, and 23c, around the load terminals 40, and extend to the peripheral portion 42 of the PCB 20.

Figure 5A:
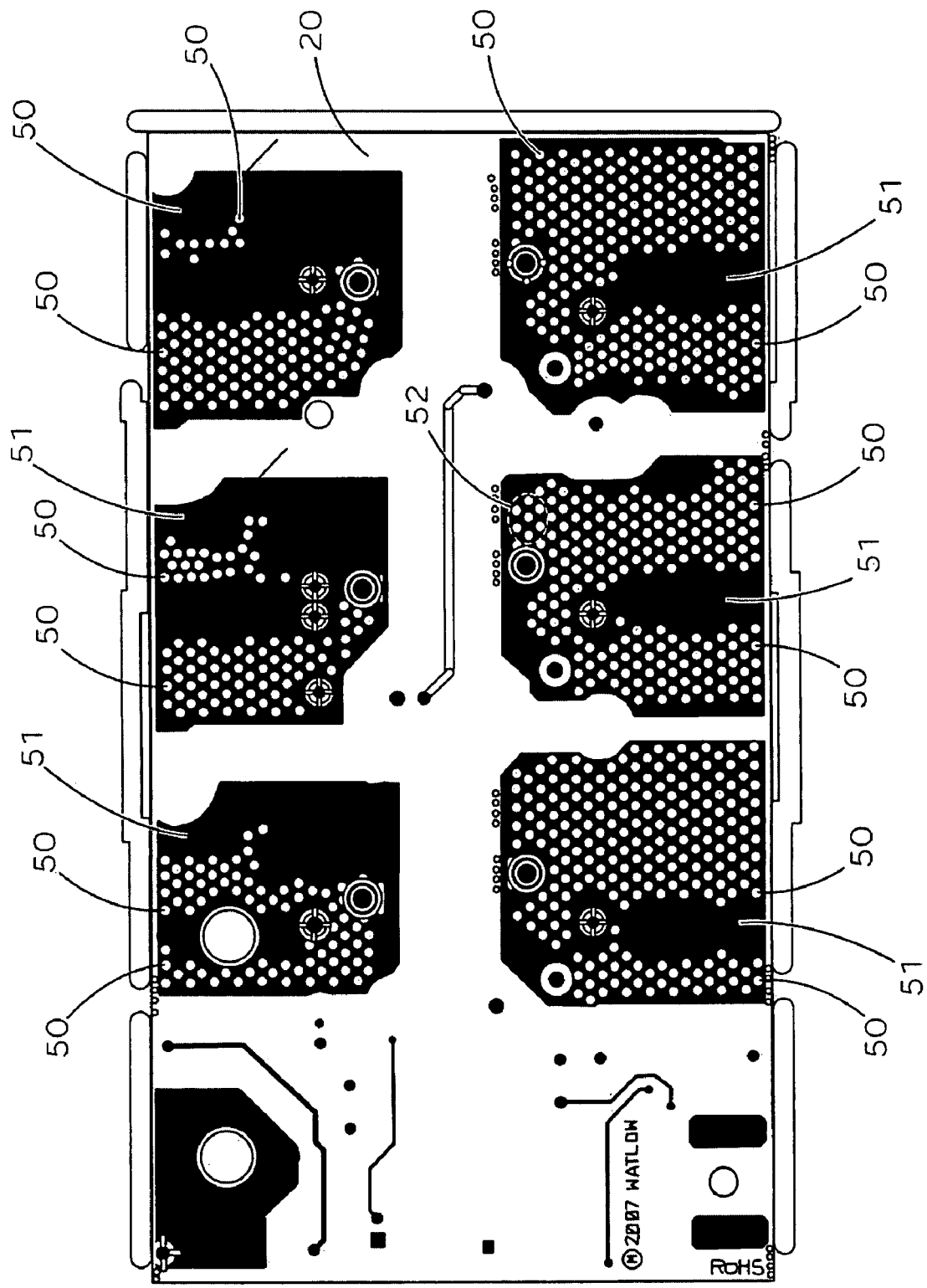
FIG. 5a is a top view of the PCB, with the electrical components removed for clarity to more clearly illustrate heat transfer elements constructed in accordance with the principles of the present disclosure.
Figure 5B:
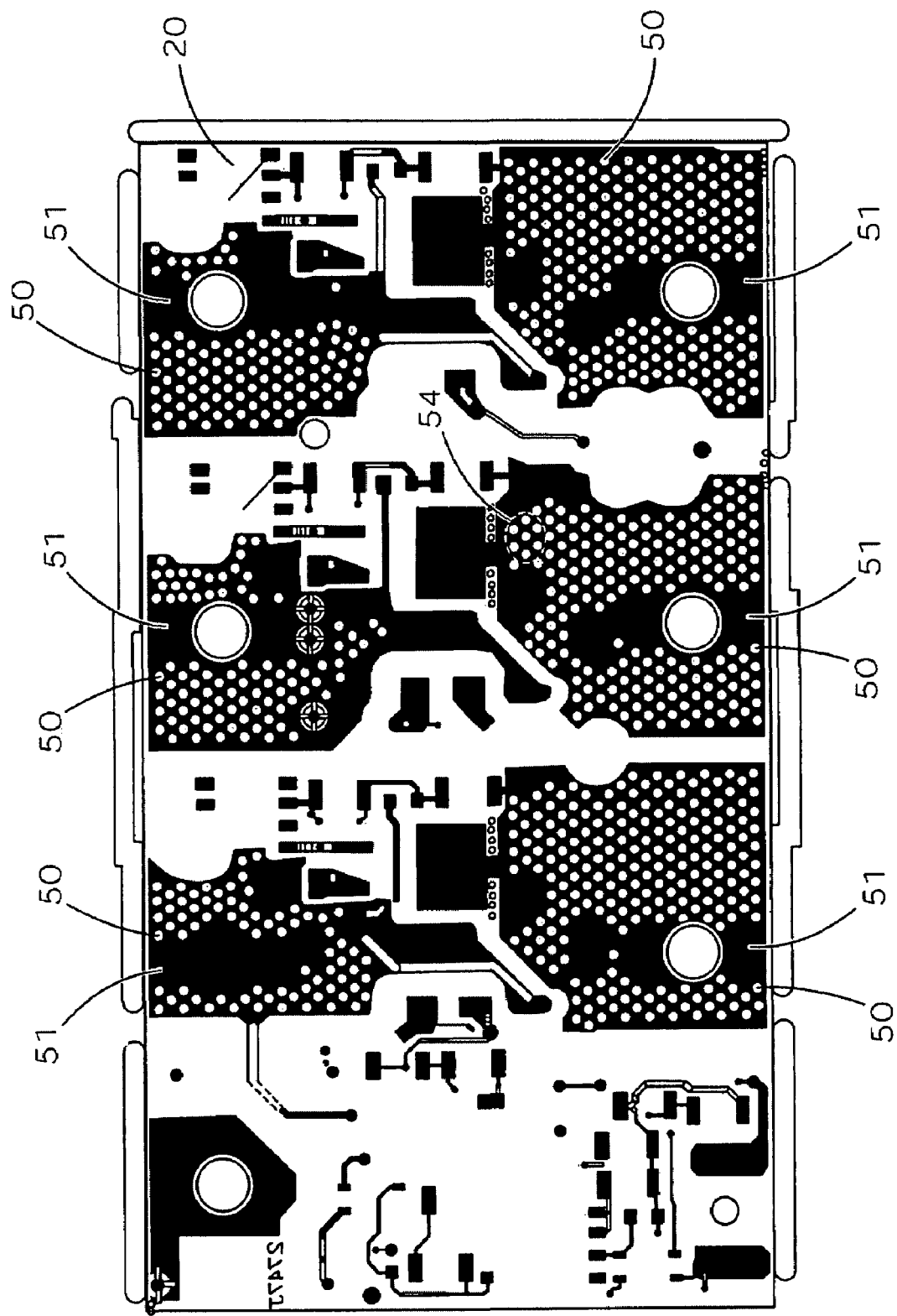
FIG. 5b is a mirrored bottom view of the PCB, with the electrical components removed for clarity to more clearly illustrate heat transfer elements constructed in accordance with the principles of the present disclosure.
Figure 5C:
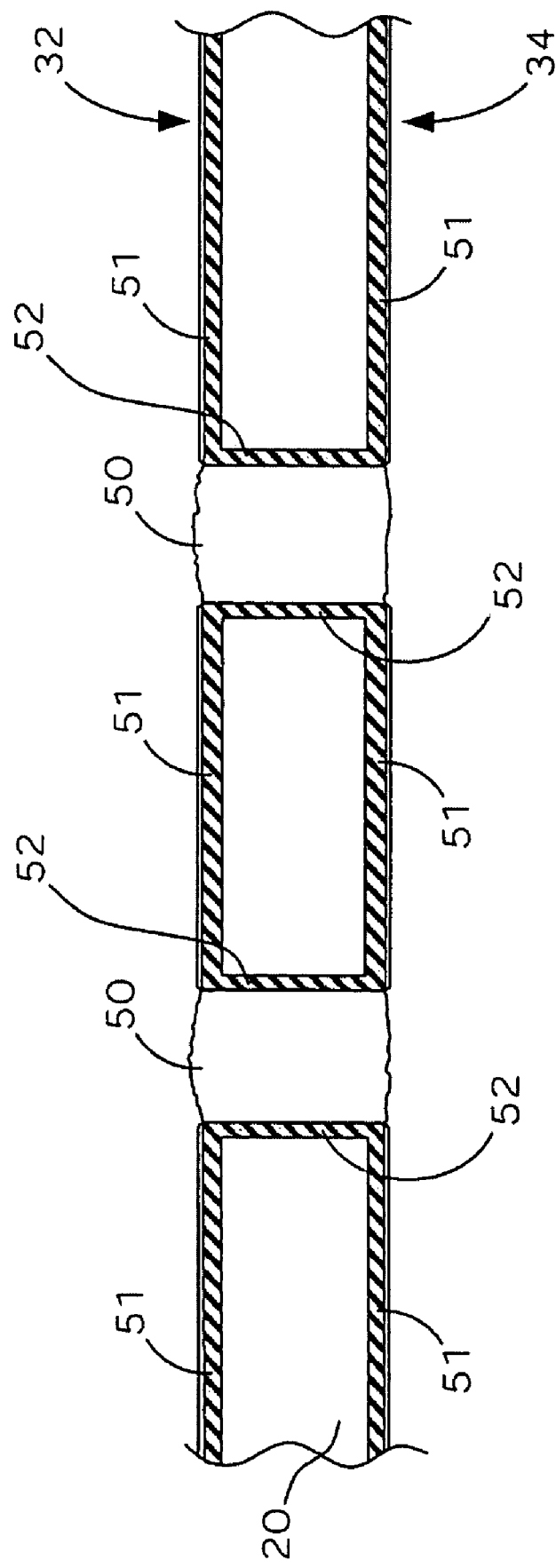
FIG. 5c is a cross-sectional view taken through the heat transfer elements constructed in accordance with the principles of the present disclosure.

Referring to FIG. 5c, the lands 51 are sandwiched within the material of the PCB 20, and the nodes 50 extend transversely through the material of the PCB 20 and the lands 51. Furthermore, in one form, linings 52 are provided between the nodes 50 and the surrounding material of the PCB 20 and the lands 51 for electrical continuity between the top side 32 and the bottom side 34. The linings 52 and the lands 51 are preferably a copper material, and are electrically connected to terminals of the relays 23a, 23b, and 23c and also to the load terminals 40, among other electrical circuit components. Although the copper lands 51 reduce electrical resistance and power dissipation, and thus heat generation, the nodes 50 are provided to further improve heat dissipation. The nodes 50 are preferably disposed transversely through the copper lands 51 and the PCB 20, and extend to an exterior surface of the PCB 20, preferably on both the top side 32 and the bottom side 34 as shown.

During operation, a portion of the heat generated by the relays 23a, 23b, and 23c, among other electrical components, is transferred through the heat transfer elements, and more specifically the lands 51 and the nodes 50, to the terminals 40, and through both of the housing 12 (which is described in greater detail below) and the power wires 48. As such, the heat transfer elements provide an efficient heat transfer path for the heat generated during operation such that a conventional heat sink member, (e.g., conductive body with fins or u-shaped members, potting compounds), is not required, thus providing a more compact and efficient power switching device 10. The heat transfer elements also function to reduce load current path resistance, reduce radiation, and increase thermal conductivity.

In one form, the nodes 50 are formed by drilling holes through the PCB 20 and then filling the holes with a conductive filler material. The nodes 50 preferably comprise a conductive metal filler that is copper, nickel, and gold, and are approximately 0.032 inches (0.013 cm) in diameter as shown in one form of the present disclosure. It should be understood that other types of conductive fillers, such as silver or tin, may also be employed while remaining within the scope of the present disclosure. As long as the material is capable of sufficiently transferring heat away from the relays 23a, 23b, and 23c, and other electrical components, such materials shall be construed as being within the scope of the present disclosure. Furthermore, in one form, the present disclosure avoids the use of lead in order to provide a PCB 20 that is ROHS compliant. Moreover, shapes other than the circular nodes 50 as illustrated may also be employed while remaining within the scope of the present disclosure.

As more clearly shown in FIGS. 5a and 5b, the nodes 50 in one form are unevenly distributed across the lands 51 shown but may also be evenly distributed (not shown) while remaining within the scope of the present disclosure. Within a given distribution, the nodes 50 in one form are disposed in a general honeycomb pattern 54, shown by the dashed line around 6 nodes 50. More specifically, the center node 50 is surrounded by six (6) additional nodes, each of which are spaced 60 degrees apart. Additionally, although the nodes 50 are illustrated as being the same size, a variety of sizes and shapes may be employed, in addition to other locations throughout the PCB 20, while remaining within the scope of the present disclosure. It should also be understood that other types and configurations of heat transfer elements that function to dissipate heat generated by electronic components of the power switching device 10 may be employed while remaining within the scope of the present invention. For example, heat transfer elements that are not necessary integrally formed within the PCB 20 may be employed, such as heat transfer elements that are separately and externally attached to the PCB 20. Such variations are intended to be within the scope of the present disclosure.

Figure 6:
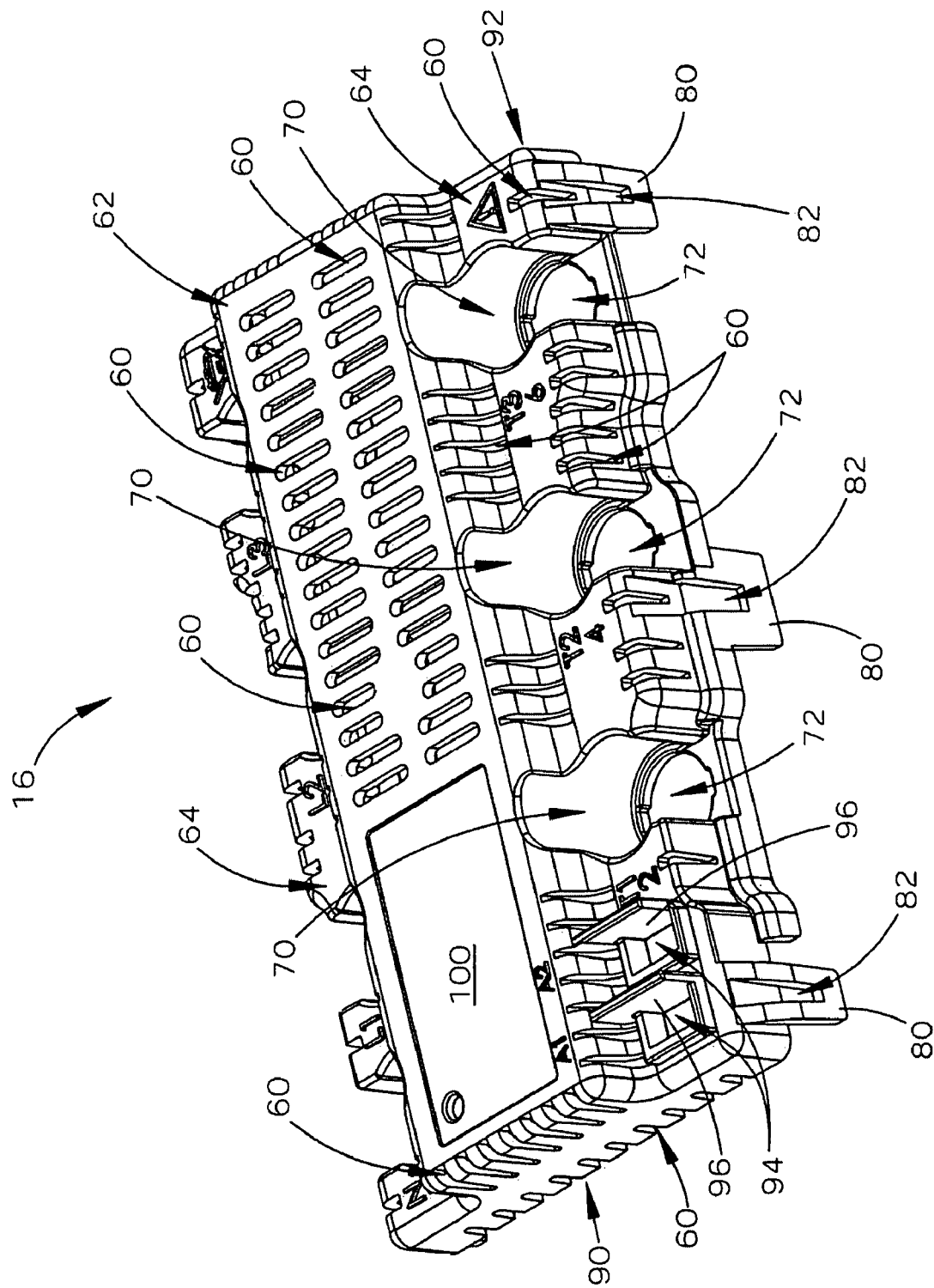
FIG. 6 is a perspective view of a housing cover of the power switching device constructed in accordance with the principles of the present disclosure.
Figure 7:
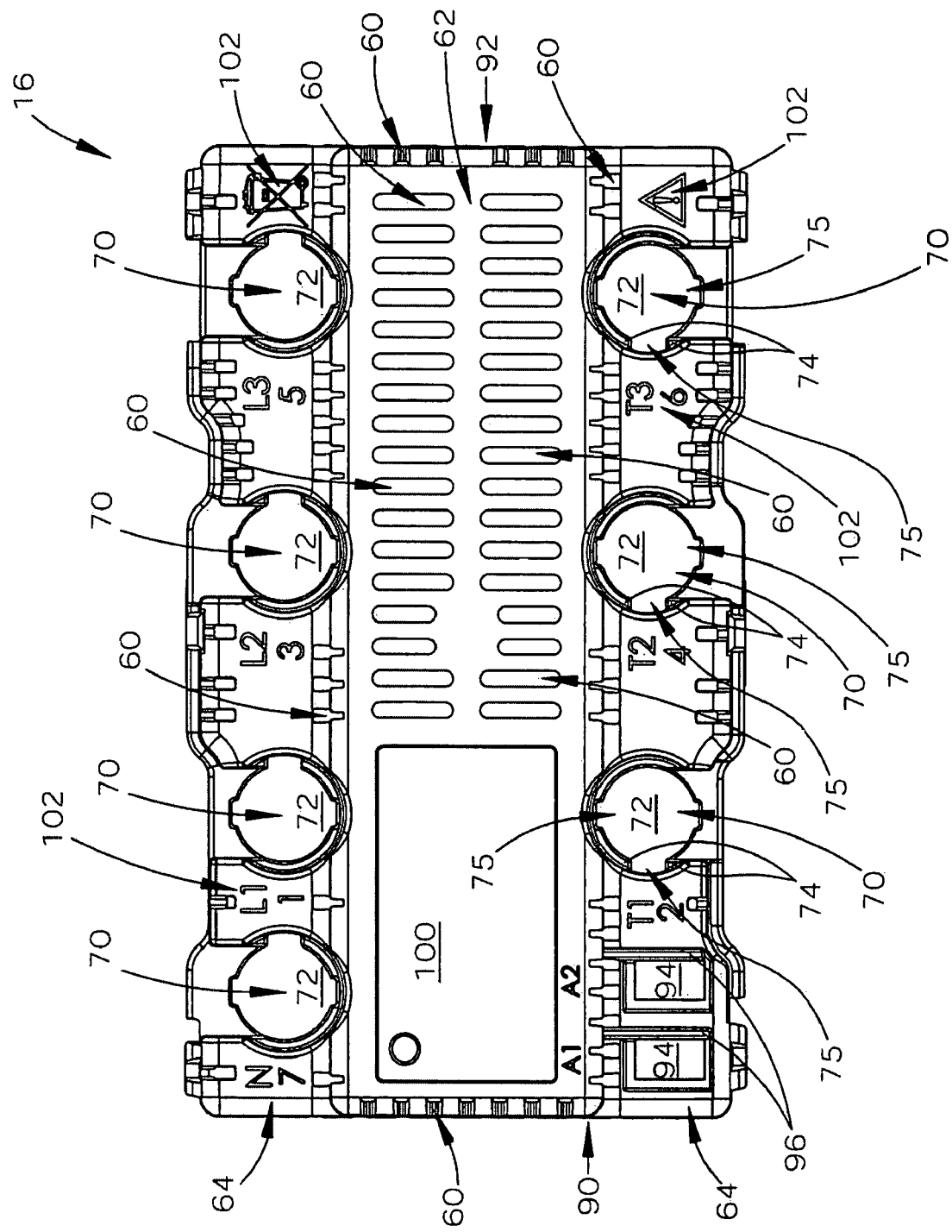
FIG. 7 is a top view of the housing cover in accordance with the principles of the present disclosure.
Figure 8:
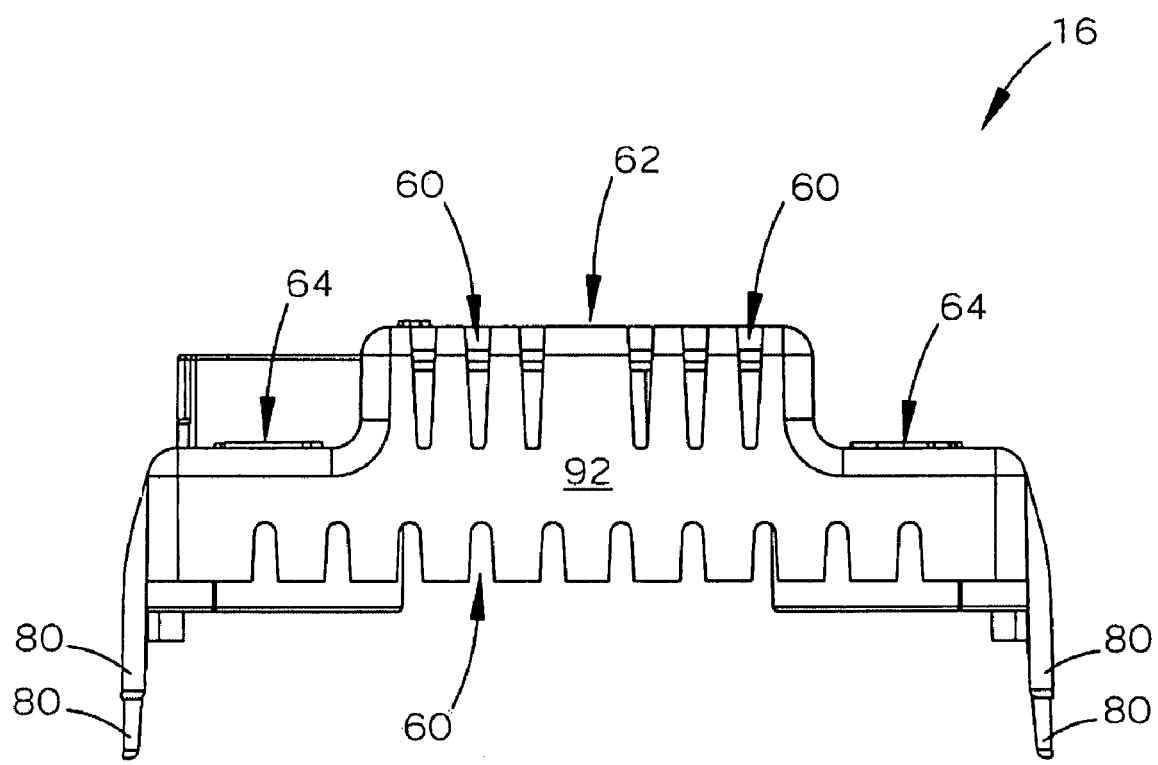
FIG. 8 is a side view of the housing cover illustrating raised and stepped portions and constructed in accordance with the principles of the present disclosure.

Referring now to FIGS. 6 through 8, the cover 16 of the housing 12 is illustrated and now described in greater detail. As shown, the cover 16 is generally rectangular in shape and comprises a plurality of vents 60, which are designed to increase thermal convection and thus the transfer of heat generated by the relays 23 and other electronic components inside the housing 12 to the outside environment during operation. In one form, the cover 16 includes a raised portion 62 and stepped portions 64 on opposite sides of the raised portion 62. Referring back to FIG. 2, the raised portion 62 is proximate the relays 22 and 23, and the stepped portions 64 are proximate the load terminals 40. As such, a more compact power switching device 10 is provided by the shape and design of the cover 16 as set forth herein.

As shown in FIGS. 1, 6, and 7, the cover 16 further comprises terminal access portions 70 that provide external access to the load terminals 40. Therefore, the load terminals 40 can be accessed by a user without having to remove the cover 16. In one form, the terminal access portions 70 define openings 72 in the cover 16 as shown. Preferably, the terminal access portions 70 are integrally formed with the cover 16, but may alternately be provided in the form of removable covers (not shown) while remaining within the scope of the present disclosure. Within the openings 72, the cover 16 further comprises stops 74 and recesses 75 (best shown in FIG. 7) that are adapted for engagement by extensions 46 of the ring terminals 44 as previously described. Namely, the extensions 46 of the ring terminals 44 are disposed within the recesses 75, and the stops 74 prevent the ring terminals 44 from turning when the screws 47 are tightened and/or loosened in the load terminals 40. In one form, the stops 74 are integrally formed in the cover 16.

Figure 9:
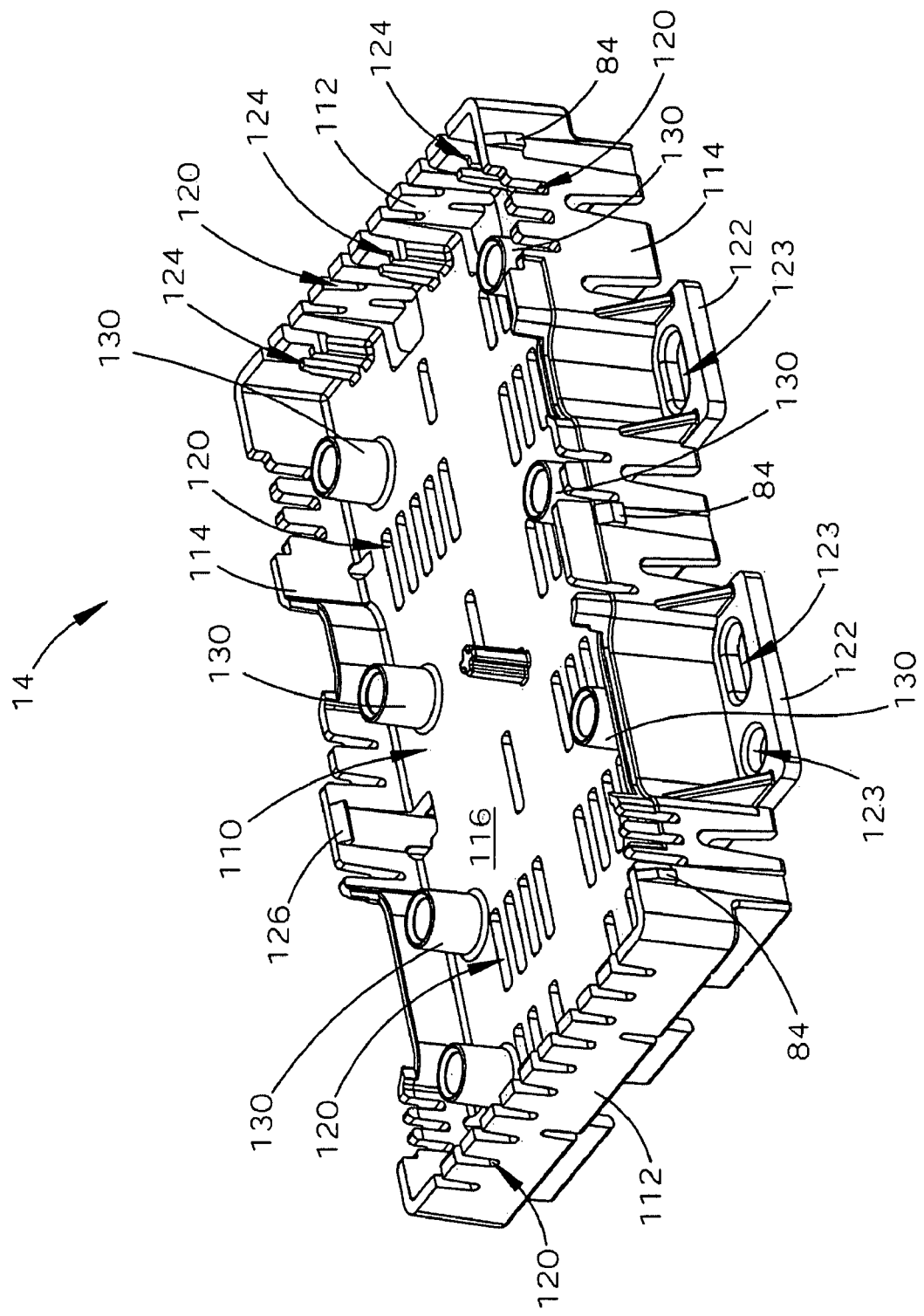
FIG. 9 is a perspective view of a housing base of the power switching device constructed in accordance with the principles of the present disclosure.

The cover 16 also comprises a plurality of flexible tabs 80 that include openings 82 that are adapted to engage features of the base 14 so that the cover 16 and the base 14 are removably engageable with one another. As shown in FIGS. 1 and 9, these features of the base 14 include external tabs 84, which are engaged by the openings 82 of the flexible tabs 80. When the flexible tabs 80 are displaced outwardly, the openings 82 disengage from the external tabs 84 on the base 14, and the cover 16 can then be removed from the base 14. When the cover 16 is placed back over the base 14, the flexible tabs 80 are displaced outwardly such that the external tabs 84 are positioned proximate the openings 82, and then the flexible tabs 80 are released such that the openings 82 engage the external tabs 84 to secure the cover 16 to the base 14.

As further shown, the vents 60 are formed through the raised portion 62, the stepped portions 64, and also along the end portions 90 and 92. It should be understood that the vents 60 can be of a variety of shapes and sizes as shown, and the specific configurations as illustrated herein should not be construed as limiting the scope of the present disclosure.

The cover 16 also includes cutouts 94 and spacers 96 that are configured to accommodate the power terminals 98 disposed on the PCB 20 as shown in FIGS. 1, 2, and 3a. The spacers 96 preferably extend upwardly from the stepped portion 64 so as to provide additional dielectric separation between the power terminals 98. Both the cutouts 94 and the spacers 96 are integrally formed in the cover 16 in one form of the present disclosure.

Additional features of the cover 16 include, by way of example, a label area 100 that can be used to secure a product label with information such as, by way of example, part number, load voltage, amperage, and operating temperature range, among others. Other features, as best shown in FIG. 7, include indicia 102 as to the load or terminal number, along with appropriate warnings and cautions. Preferably, the indicia 102 are integrally formed with the cover 16, however, other approaches may be employed, such as by way of example, decals or painting, among others. The indicia 102 as shown are merely exemplary, and thus it should be understood that other indicia 102 may be employed while remaining within the scope of the present disclosure.

The material for the cover 16 is preferably electrically nonconductive, and in one form is Ultem® 1000, in order to meet certain operational requirements of the power switching device 10 such as flammability requirements. It should be understood that other types of thermoplastics and other electrically nonconductive materials may be employed while remaining within the scope of the present disclosure.

Figure 10:
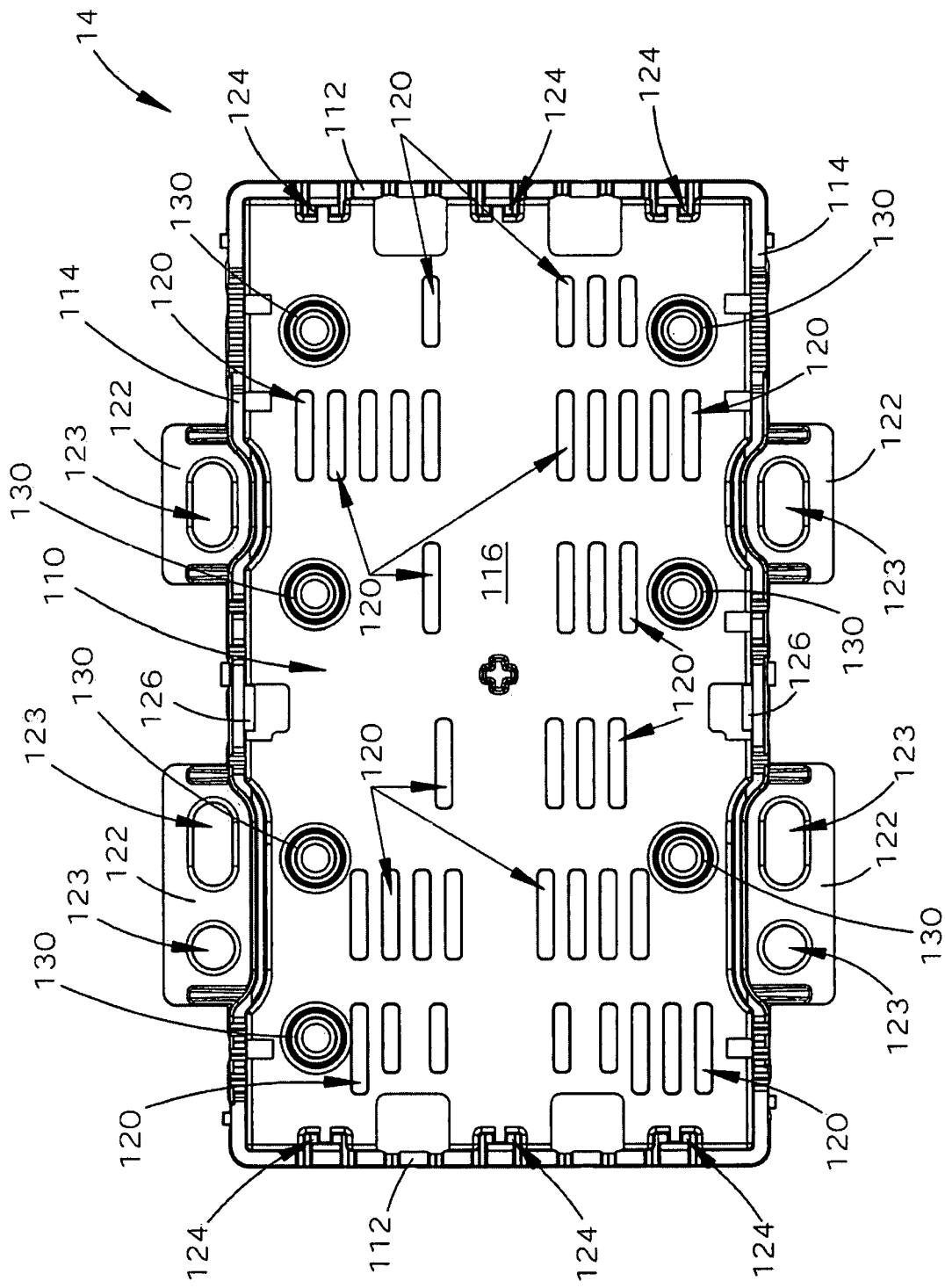
FIG. 10 is a top view of the housing base in accordance with the principles of the present disclosure.
Figure 11:
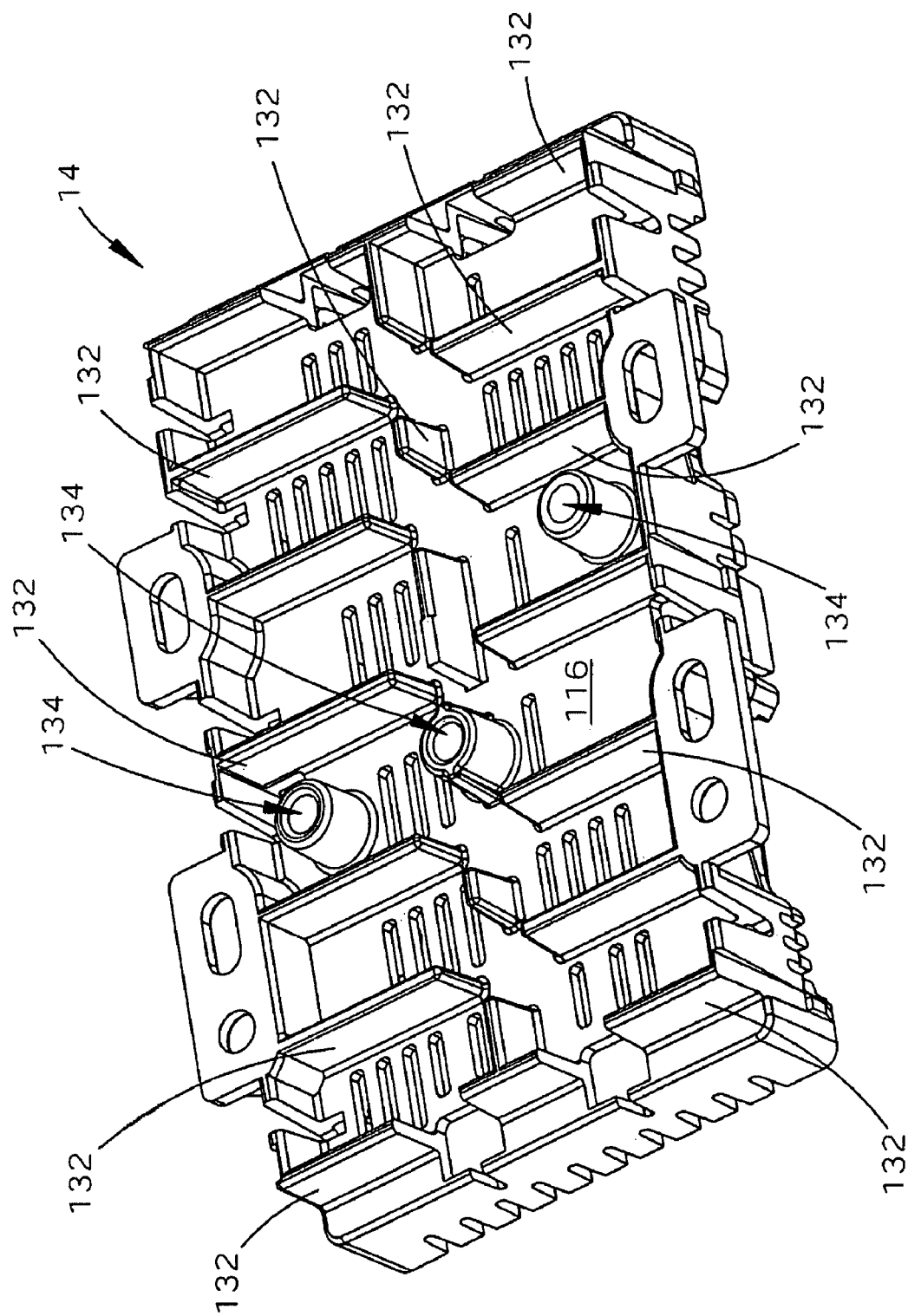
FIG. 11 is a bottom perspective view of the housing base in accordance with the principles of the present disclosure.

Referring now to FIGS. 9 through 11, the base 14 of the housing 12 is illustrated and now described in greater detail. The base 14 generally comprises a rectangular shape to match that of the cover 16 and includes a cavity 110 on its upper side surrounded by side walls 112 and 114, and a floor 116. A plurality of vents 120 are formed through the base 14, and more specifically through the side walls 112 and 114, and floor 116. The vents 120 are designed to increase the transfer of heat generated by the relays 23 and other electronic components inside the housing 12 to the outside environment during operation. In one form, the vents 120 are partial along the side walls 112, and correspond with the vents 60 along the end portions 90 and 92 of the cover 16 as shown in FIG. 6 and in FIG. 1.

The base 14 further comprises a plurality of mounting flanges 122 that extend from side walls 114. The mounting flanges 122 include openings 123 that are provided such that the power switching device 10 can be mounted to an adjacent structure or to the adapter 30 (FIGS. 1 and 2), which is described in greater detail below. As further shown, the base 14 also includes a plurality of ledge portions 124 disposed within the cavity 110 that extend from the side walls 112. When assembled, the ledge portions 124 support the PCB 20 such that the electronic components and the heat generated therefrom are spaced from the floor 116 in order to increase thermal convection and to provide a path for heat transfer from the PCB 20 through the vents 120 and to the outside environment. The side walls 114 also include flexible tabs 126, which snap over the peripheral portion 42 of the PCB 20 to secure the PCB 20 within the base 14 when assembled.

As further shown, a plurality of standoffs 130 extend from the floor 116 and are configured to accommodate the screws 47 extending from the load terminals 40 of the PCB 20, which are best shown in FIG. 3b. The standoffs 130 provide additional electrical and thermal isolation between the load terminals 40 and the electronic components mounted to the PCB 20, and also to the outside environment.

Referring to FIG. 11, the bottom of the base 14 further comprises a plurality of supports 132 that extend from the floor 116 to create a standoff between the base 14 and an adjacent structure such as a DIN rail. Such a standoff further improves thermal convection and heat transfer away from the electronic components of the power switching device 10 to the outside environment. The bottom of the base 14 also includes a plurality of apertures 134 that are configured to receive features of the adapter 30, which is described in greater detail below.

Similar to the cover 16 as previously described, the material for the base 14 is preferably electrically nonconductive, and in one form is Ultem® 1000, in order to meet certain operational requirements of the power switching device 10 such as flammability requirements. It should be understood that other types of thermoplastics and other electrically nonconductive materials may be employed while remaining within the scope of the present disclosure.

Figure 12:
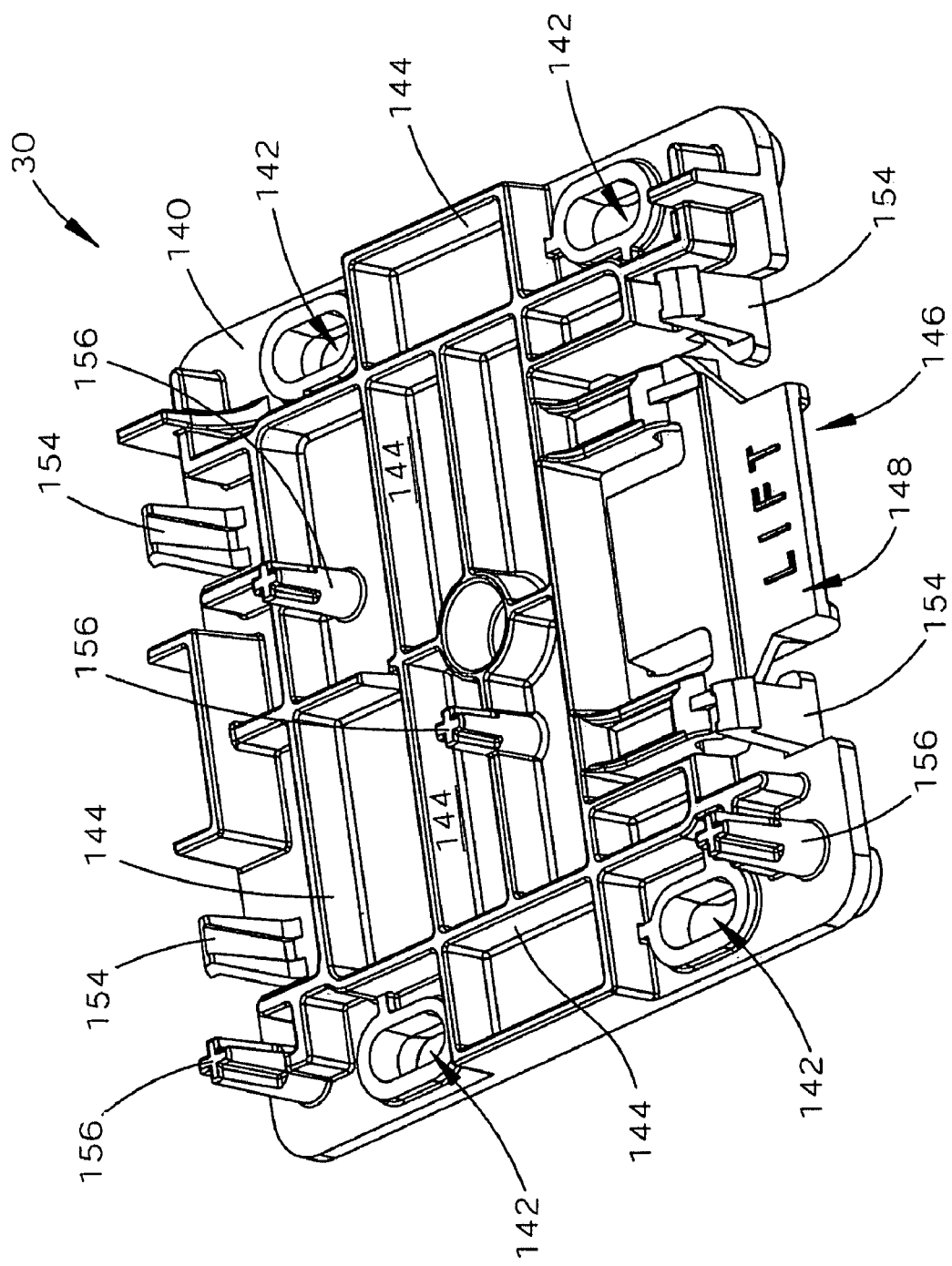
FIG. 12 is a top perspective view of an adapter that is used to mount the power switching device to a DIN rail, constructed in accordance with the principles of the present disclosure.
Figure 13:
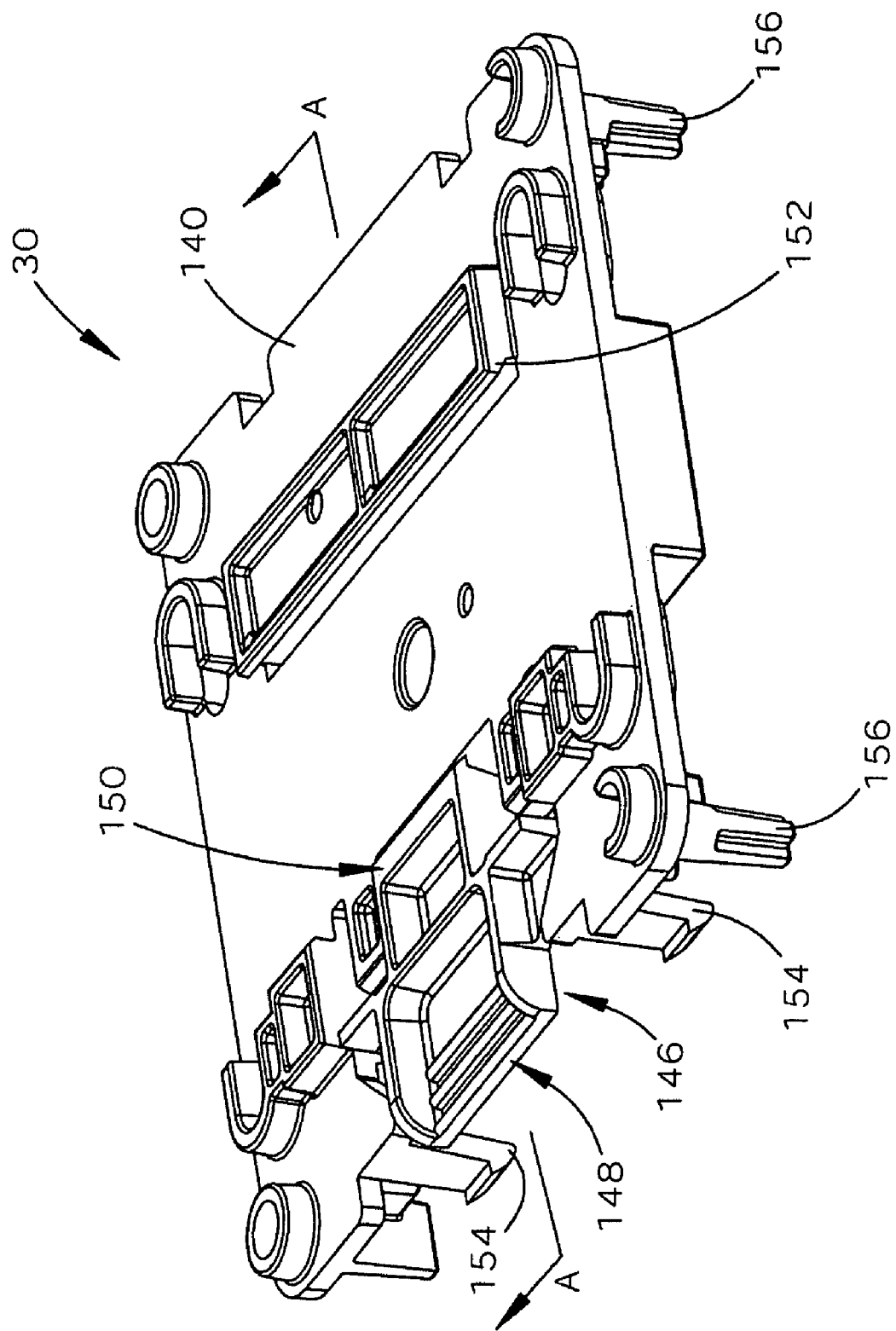
FIG. 13 is a bottom perspective view of the adapter in accordance with the principles of the present disclosure.
Figure 14:
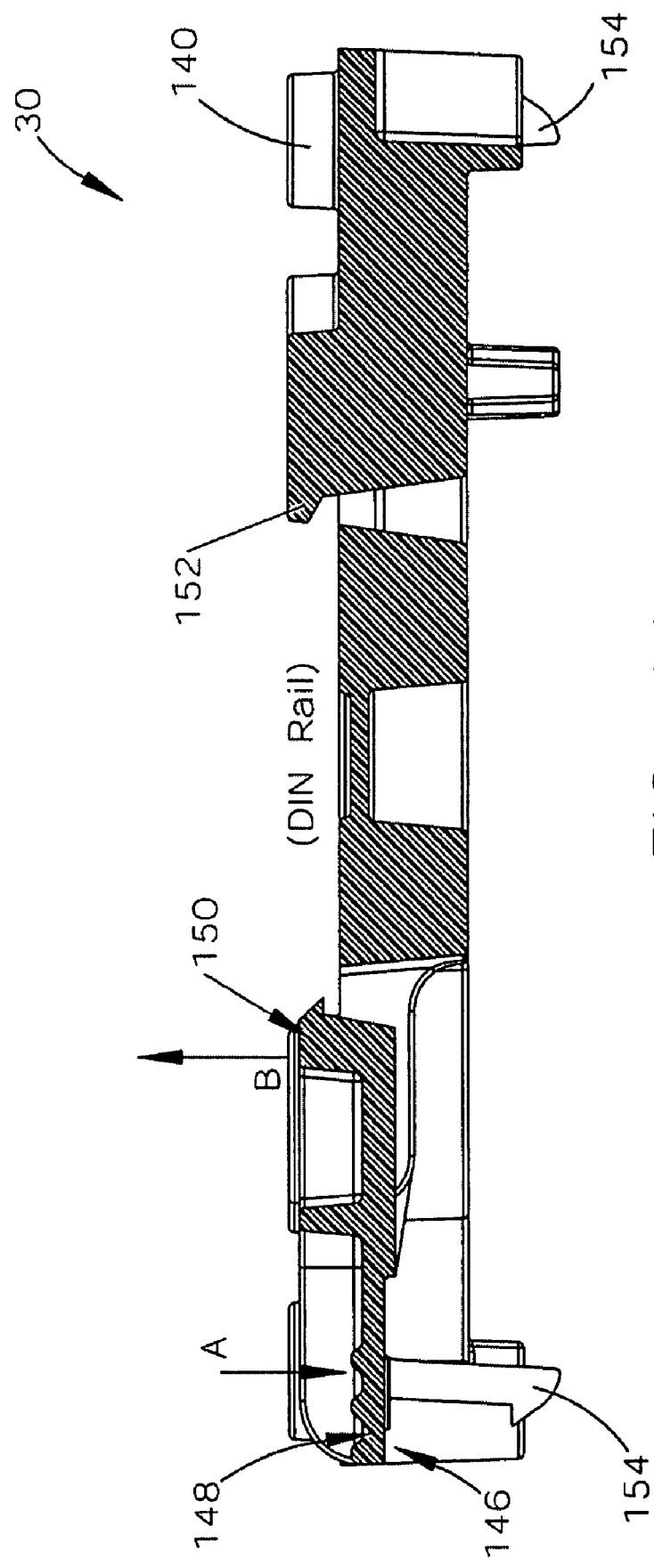
FIG. 14 is a cross-sectional view of the adapter, taken along line A-A of FIG. 13, illustrating the locking details of the adapter with respect to a DIN rail in accordance with the principles of the present disclosure.

Referring to FIGS. 12-14, the adapter 30 is illustrated and is now described in greater detail. The adapter 30 comprises a body 140 that defines a plurality of apertures 142 and a plurality of supports 144. A release lever 146 is operatively engaged with the body 140 and defines a lift portion 148 and a locking portion 150. On the back side of the adapter 30, as best shown in FIGS. 13 and 14, a raised lip 152 extends along the body 140 opposite the locking portion 150. Furthermore, the adapter 30 comprises a plurality of flexible tabs 154 that extend from the body 140 on the front side, as best shown in FIG. 12. Mounting posts 156 also extend from the front side of the adapter 30, and are configured to engage the apertures 134 of the base 14, which is described in greater detail below.

The raised lip 152 and the locking portion 150 of the release lever 146 are adapted for engaging a DIN rail (not shown), which is positioned between these two features as best shown in FIG. 14. When the lift portion 148 of the release lever 146 is lifted by a user in the direction of arrow A, the locking portion 150 moves in the direction of arrow B to disengage the locking portion 150 from the DIN rail. When the adapter 30 is being mounted to the DIN rail, the raised lip 152 is engaged with one side of the DIN rail, the release lever 146 is lifted in the direction of arrow A to clear the locking portion 150 from the other side of the DIN rail, and then the release lever 146 is released so that the locking portion 150 engages the DIN rail to secure the adapter 30 thereto.

Referring back to FIG. 12 and also to FIG. 1, the flexible tabs 154 are adapted to engage and disengage the base 14 of the housing 12 through openings 123 of the mounting flanges 122. The flexible tabs 154 are deflected inwardly to release the power switching device 10 from the adapter 30 and are released to engage the power switching device 10.

Referring now to FIGS. 11 and 12, the mounting posts 156 of the adapter 30 are configured to be received by the apertures 134 of the base 14. Additionally, the mounting posts 156 are positioned to extend through the openings 123 in the flanges 122 of the base 16, in order to properly position the power switching device 10 to the adapter 30. With the adapter 30, the power switching device 10 is configured to be mounted horizontally onto a DIN rail or other adjacent structure. The power switching device 10 may alternately be mounted vertically to a DIN rail or other adjacent structure through the openings 123 in the flanges 122 of the base 16, without using the adapter 30 in another form of the present disclosure.

The description of the various embodiments is merely exemplary in nature and, thus, variations that do not depart from the gist of the examples and detailed description herein are intended to be within the scope of the present disclosure. Such variations are not to be regarded as a departure from the spirit and scope of the present disclosure.

What is claimed is:

1. A power switching device comprising:
    a housing;
    a printed circuit board disposed within the housing, the printed circuit board defining a central portion and a peripheral portion surrounding the central portion;
    a plurality of electrical components mounted to the printed circuit board including at least one relay mounted proximate the central portion;
    at least one pair of load terminals connected to the printed circuit board proximate the peripheral portion, the load terminals disposed on opposite sides of the relay; and
    a plurality of heat transfer elements comprising nodes and lands formed through and in the printed circuit board and dispersed proximate the relay, around the load terminals, and extending to the peripheral portion.

2. The power switching device according to claim 1, wherein the housing comprises a plurality of vents.

3. The power switching device according to claim 1, wherein the housing comprises a base and a cover, the base and the cover being removably engageable with each other.

4. The power switching device according to claim 3, wherein the cover defines a raised portion proximate the at least one relay and stepped portions proximate the load terminals.

5. The power switching device according to claim 3, wherein the base defines a plurality of mounting flanges.

6. The power switching device according to claim 1, wherein the heat transfer elements comprise a conductive metal filler selected from the group consisting of copper, nickel, gold, silver, and tin.

7. The power switching device according to claim 1, wherein the heat transfer elements are unevenly distributed.

8. The power switching device according to claim 1, wherein the heat transfer elements are approximately the same size.

9. The power switching device according to claim 1 further comprising power wire connected to the load terminals.

10. The power switching device according to claim 1, wherein the load terminals comprise ring terminals.

11. The power switching device according to claim 1 further comprising an adapter configured for attachment to the housing for mounting the power switching device to a DIN rail.

12. The power switching device according to claim 11, wherein the adapter comprises a flexible release lever adapted for engaging and disengaging the DIN rail such that the power switching device can be quickly secured to and removed from the DIN rail.

13. The power switching device according to claim 11, wherein the adapter comprises flexible tabs adapted for engaging and disengaging the housing.

14. The power switching device according to claim 1, wherein the housing comprises terminal access portions that provide external access to the load terminals.

15. The power switching device according to claim 14, wherein the terminal access portions are integrally formed in the housing.

16. The power switching device according to claim 14, wherein the terminal access portions define openings in the housing.

17. The power switching device according to claim 14, wherein the housing further comprises stops that are adapted for engagement by ring terminals of the load terminals.

18. The power switching device according to claim 17, wherein the stops are integrally formed in the housing.

19. A power switching device comprising:
a housing comprising a plurality of vents;
a printed circuit board disposed within the housing, the printed circuit board defining a central portion and a peripheral portion surrounding the central portion;
a plurality of electrical components mounted to the printed circuit board including at least one relay mounted proximate the central portion;
at least one pair of load terminals connected to the printed circuit board proximate the peripheral portion, the load terminals disposed on opposite sides of the relay; and
a plurality of heat transfer elements comprising nodes and lands formed through and in the printed circuit board and dispersed proximate the relay, around the load terminals, and extending to the peripheral portion.

20. The power switching device according to claim 19, wherein the housing comprises a base and cover, the base and the cover being removably engageable with each other.

21. The power switching device according to claim 19, wherein the cover defines a raised portion proximate the at least one relay and stepped portions proximate the load terminals.

22. The power switching device according to claim 19 further comprising:

three relays mounted proximate the central portion;
corresponding pairs of load terminals connected to the printed circuit board proximate the peripheral portion, the load terminals disposed on opposite sides of the relays; and
a plurality of heat transfer elements formed through the printed circuit board and dispersed proximate the relays, around the load terminals, and extending to the peripheral portion.

23. The power switching device according to claim 19, wherein the vents and the heat transfer elements function to dissipate heat in multiple mounting positions of the power switching device up to about 70° C. such that the power switching device continues proper operation.

24. A printed circuit board for use in a power switching device comprising:
a central portion and a peripheral portion surrounding the central portion;
a plurality of electrical components mounted to the printed circuit board including at least one relay mounted proximate the central portion;
at least one pair of load terminals connected to the printed circuit board proximate the peripheral portion, the load terminals disposed on opposite sides of the relay; and
a plurality of heat transfer elements comprising nodes and lands formed through and in the printed circuit board and dispersed proximate the relay, around the load terminals, and extending to the peripheral portion.

25. The printed circuit board according to claim 24 further comprising:
three relays mounted proximate the central portion;
corresponding pairs of load terminals connected to the printed circuit board proximate the peripheral portion, the load terminals disposed on opposite sides of the relays; and
a plurality of heat transfer elements formed through the printed circuit board and dispersed proximate the relays, around the load terminals, and extending to the peripheral portion.

26. The printed circuit board according to claim 24, wherein the printed circuit board is RoHS compliant.

27. A power switching device comprising:
a housing comprising a raised portion, stepped portions disposed on opposite sides of the raised portion, and a plurality of vents;
a printed circuit board disposed within the housing, the printed circuit board defining a central portion and a peripheral portion surrounding the central portion;
a plurality of electrical components mounted to the printed circuit board including a plurality of relays mounted proximate the central portion and within the raised portion of the housing;
a plurality of pairs of load terminals connected to the printed circuit board proximate the peripheral portion, the load terminals disposed on opposite sides of the relays; and
a plurality of heat transfer elements comprising nodes and lands formed through and in the printed circuit board and dispersed proximate the relay, around the load terminals, and extending to the peripheral portion.

28. The power switching device according to claim 27, wherein the plurality of relays comprises three relays.

29. The power switching device according to claim 27, wherein the housing comprises a base and a cover, the base and the cover being removably engageable with each other.

30. The power switching device according to claim 27, wherein the base comprise ledge portions that support the printed circuit board.

31. The power switching device according to claim 29, wherein the base comprises flexible tabs that secure the printed circuit board within the base.

32. The power switching device according to claim 29, wherein the base comprises a plurality of standoffs that accommodate terminal screws extending through the printed circuit board.

33. The power switching device according to claim 29, wherein the vents are formed through the base and the cover.

* * * * *